(12) United States Patent
Jiang et al.

(10) Patent No.: US 6,339,607 B1
(45) Date of Patent: Jan. 15, 2002

(54) METHOD AND APPARATUS FOR MODULATED INTEGRATED OPTICALLY PUMPED VERTICAL CAVITY SURFACE EMITTING LASERS

(75) Inventors: Wenbin Jiang, Thousand Oaks; Hsing-Chung Lee, Calabasas, both of CA (US)

(73) Assignee: E2O Communications, Inc., Calabasas, CA (US)

( * ) Notice: Subject to any disclaimer, the term of this patent is extended or adjusted under 35 U.S.C. 154(b) by 0 days.

(21) Appl. No.: 09/560,008

(22) Filed: Apr. 27, 2000

Related U.S. Application Data

(63) Continuation-in-part of application No. 09/430,570, filed on Oct. 29, 1999.

(51) Int. Cl.[7] .............................................. H01S 5/100
(52) U.S. Cl. .......................... 372/50; 372/75; 372/93; 372/96
(58) Field of Search ............................. 372/43–50, 96, 372/75

(56) References Cited

U.S. PATENT DOCUMENTS

| | | | |
|---|---|---|---|
| 3,949,320 A | | 4/1976 | Castleberry et al. |
| 4,633,476 A | * | 12/1986 | Scifres et al. .................. 372/45 |
| 4,878,104 A | | 10/1989 | Reed et al. |
| 4,901,330 A | | 2/1990 | Wolfram et al. |
| 5,008,717 A | | 4/1991 | Bar-Joseph et al. |
| 5,023,879 A | | 6/1991 | Wang et al. |
| 5,163,058 A | | 11/1992 | Farries et al. |
| 5,165,065 A | | 11/1992 | Reed et al. |

(List continued on next page.)

FOREIGN PATENT DOCUMENTS

| | | |
|---|---|---|
| DE | 4444 470 A1 | 5/1996 |

OTHER PUBLICATIONS

O'Shea, Donald C., Introduction to Lasers and Their Applications, Dec. 1978, Addison–Wesley Publishing Company, Reading, Massachusetts.

Verdeyen, Joseph T., Laser Electronics, 1995, Prentice–Hall, Inc. Englewood Cliffs, New Jersey.

Barron, C.C., Mahon, C.J., Thibeault, B.J., Wang, G., Jiang, W., Coldren, Larry, Millimeter–Wave Asymmetric Fabry+ Perot Modulators, Aug. 1995, IEEE.

Hecht, Jeff, Understanding Fiber Optics, 1987, pp. 116–123, Howard W. Sams & Company, Indianapolis, Indiana.

(List continued on next page.)

Primary Examiner—Teresa M. Arroyo
Assistant Examiner—Darienne Monbleau
(74) Attorney, Agent, or Firm—Blakely Sokoloff Taylor & Zafmann

(57) ABSTRACT

Modulated integrated optically pumped vertical cavity surface emitting lasers are formed by integrating an electrically pumped semiconductor laser and a vertical cavity surface emitting laser (VCSEL) together with a means of direct modulation of the electrically pumped semiconductor laser. In the preferred embodiments, the electrically pumped semiconductor laser is a type of folded cavity surface emitting laser (FCSEL). In a number of embodiments, the FCSEL is partitioned into two sections by a gap in material layers. In these embodiments, one section of the FCSEL is biased so as to maintain the generation of photons at a constant power level to pump the optically pumped VCSEL while the second section of the FCSEL is used for modulation and causes the optically pumped VCSEL to be modulated above the threshold. In another embodiment, an electric-absorption modulator is sandwiched between an electrically pumped FCSEL and an optically pumped VCSEL. The electric-absorption modulator acts similar to a camera shutter and allows photons to pass through from the electrically pumped FCSEL to the optically pumped VCSEL when in one state and attenuates photons before reaching the optically pumped VCSEL when in another state.

66 Claims, 8 Drawing Sheets

U.S. PATENT DOCUMENTS

| | | | |
|---|---|---|---|
| 5,216,687 A | | 6/1993 | Fujino et al. |
| 5,231,642 A | * | 7/1993 | Scifres et al. ................. 372/75 |
| 5,291,502 A | * | 3/1994 | Pezeshki et al. |
| 5,351,256 A | * | 9/1994 | Schneider et al. ............ 372/45 |
| 5,414,726 A | * | 5/1995 | Raj et al. ...................... 372/26 |
| 5,461,637 A | | 10/1995 | Mooradian et al. |
| 5,504,772 A | * | 4/1996 | Deacon et al. |
| 5,513,204 A | | 4/1996 | Jayaraman |
| 5,536,085 A | * | 7/1996 | Li et al. |
| 5,623,359 A | * | 4/1997 | Giles et al. ................. 359/180 |
| 5,625,635 A | | 4/1997 | Kurtz et al. |
| 5,627,853 A | | 5/1997 | Mooradian et al. |
| 5,671,243 A | * | 9/1997 | Yap ............................. 372/50 |
| 5,680,411 A | * | 10/1997 | Ramdane et al. ............. 372/50 |
| 5,778,015 A | * | 7/1998 | Gunning et al. ............. 372/25 |
| 5,793,787 A | | 8/1998 | Meyer et al. |
| 5,796,771 A | * | 8/1998 | DenBaars et al. ............ 372/75 |
| 5,835,517 A | | 11/1998 | Jayaraman et al. |
| 5,914,976 A | | 6/1999 | Jayaraman et al. |
| 5,963,567 A | * | 10/1999 | Veselka et al. |
| 5,985,686 A | | 11/1999 | Jayaraman |
| 6,054,335 A | | 4/2000 | Sun et al. |
| 6,097,742 A | | 8/2000 | Caprara et al. |
| 6,104,739 A | | 8/2000 | Hong et al. |
| 6,127,200 A | * | 10/2000 | Ohiso et al. .................. 438/46 |
| 6,167,068 A | | 12/2000 | Caprara et al. |
| 6,195,381 B1 | * | 2/2001 | Botez et al. .................. 372/96 |

OTHER PUBLICATIONS

O'Shea, Donald, Callen, W. Russell & Rhodes, William, Introduction to Lasers and Thier Applications, pp. 217–241, Dec. 1978, Addison–Wesley Publishing Company.

Dorf, Richard, The Electrical Engineering Handbook, pp. 1417–1427, 1993, CRC Press, Inc., Boca Raton, FL.

Laser Electronics, Joseph T. Verdeyen; 1995; Prentice–Hall; pp. 347–351; 517–534.

Semiconductor Lasors II, Materials and Structures; Eli Kapon; Academic Press; pp. 164–179.

* cited by examiner

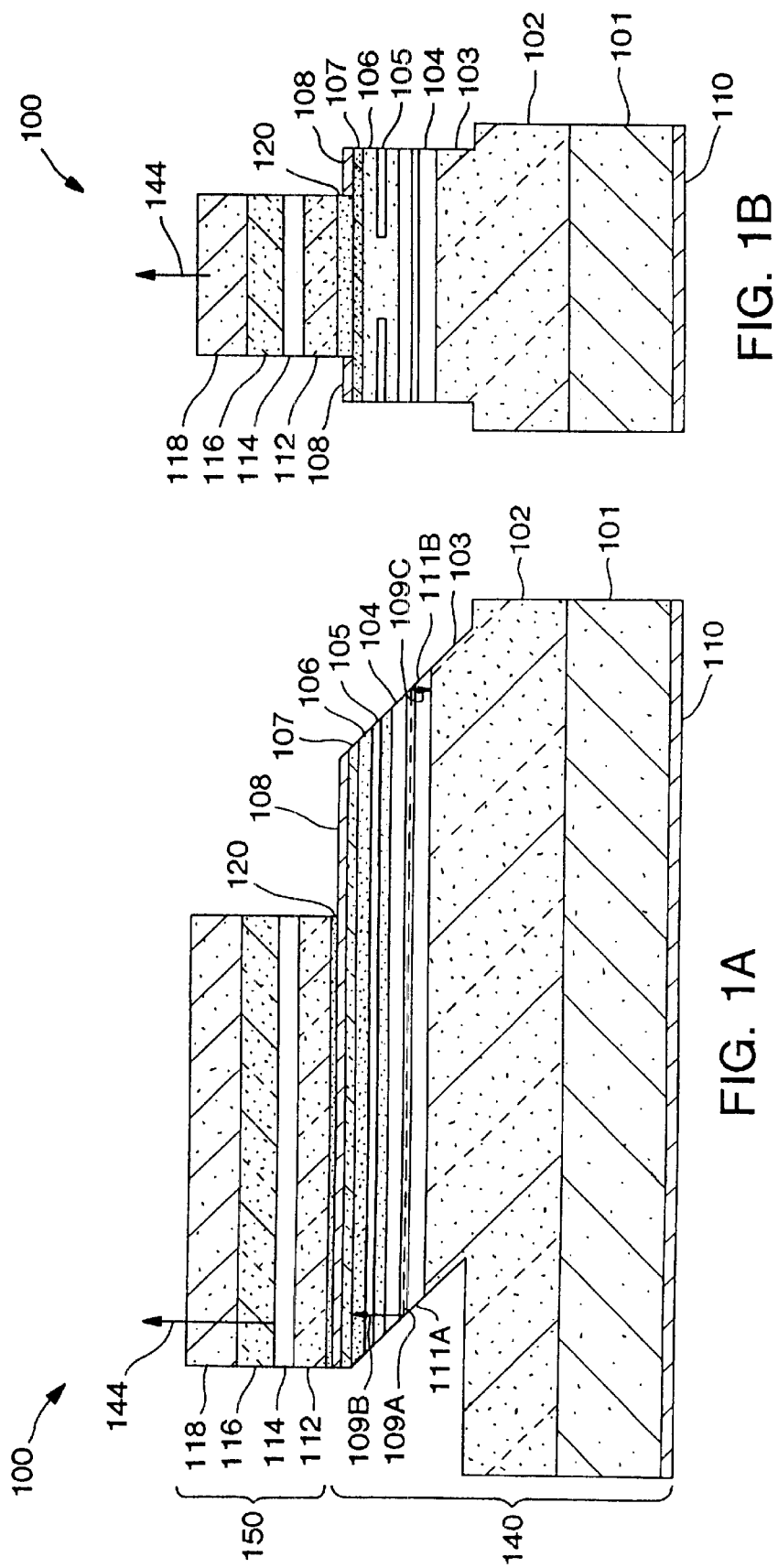

US 6,339,607 B1

METHOD AND APPARATUS FOR MODULATED INTEGRATED OPTICALLY PUMPED VERTICAL CAVITY SURFACE EMITTING LASERS

CROSS REFERENCE TO RELATED APPLICATIONS

This application is a continuation-in-part application and claims the benefit of U.S. application Ser. No. 09/430,570, filed Oct. 29, 1999 by inventors Wenbin Jiang et al, the disclosure of which prior application is hereby incorporated by reference, verbatim and with the same effect as though it were fully and completely set forth herein, both of which are to be assigned to E2o Communication, Inc.

FIELD OF THE INVENTION

The present invention relates generally to semiconductor lasers. More particularly, the present invention relates to modulation of semiconductor lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred component for optical interconnection of electronic components and systems via optical fibers is a semiconductor laser.

One type of well known semiconductor laser is a vertical cavity surface emitting laser (VCSEL). The current state of design and operation of VCSELs is well known. Due to optical properties of optical fibers, photons emitted at longer wavelengths from a laser tend to propagate longer distances and are less disturbed by optical noise sources. Thus, forming a VCSEL that can operate at longer wavelengths, such as a wavelength greater than 1.25 μm, is desirable.

Lasers can be excited or pumped in a number of ways. Typically, VCSELs have been electrically excited (i.e. electrically pumped) by a power supply in order to stimulate photon emission. However, achieving photon emission at long wavelengths using electrical pumping has not been commercially successful due to a number of disadvantages. More recently it has been shown that a VCSEL can be optically excited (i.e. optically pumped) to stimulate photon emission.

In order to use a semiconductor laser in communication systems, the laser output needs to be modulated somehow to communicate a signal. One type of laser modulation scheme varies the intensity of the light generated by the laser. Oftentimes this has been done externally from the laser, similar to a camera's shutter allowing light to pass through to an unexposed film. However, this requires additional elements. It is more desirable to directly modulate a semiconductor laser. However previously, direct modulation of semiconductor lasers at the desired high frequencies of communication systems has been limited by jitter and chirping in addition to turn-on delays. Turn-on delay is the time it takes for a semiconductor laser to emit photons in response to receiving an electric turn on signal. Jitter refers to the variations in the pulses of emitted photons in relation to a constant pulse train of an electric signal. Chirping refers to changes in the wavelengths of the emitted photons from a semiconductor laser.

It is desirable to overcome the limitations of the prior art.

BRIEF SUMMARY OF THE INVENTION

Briefly, the present invention includes methods, apparatus and systems as described in the claims.

Modulated integrated optically pumped vertical cavity surface emitting lasers are formed by integrating an electrically pumped semiconductor laser and a vertical cavity surface emitting laser (VCSEL) together with a means of direct modulation of the electrically pumped semiconductor laser. In the preferred embodiments, the electrically pumped semiconductor laser is a type of folded cavity surface emitting laser (FCSEL). In a number of embodiments, the FCSEL is partitioned into two sections by a gap in material layers. In these embodiments, one section of the FCSEL is biased so as to maintain the generation of photons without causing the optically pumped VCSEL to lase while the second section of the FCSEL is used for modulation and causes the optically pumped VCSEL to lase. In another embodiment, an electric-absorption modulator is sandwiched between an electrically pumped FCSEL and an optically pumped VCSEL. The electric-absorption modulator acts similar to a camera shutter and allows photons to pass through from the electrically pumped FCSEL to the optically pumped VCSEL when in one state and blocks photons from reaching the optically pumped VCSEL when in another state.

BRIEF DESCRIPTIONS OF THE DRAWINGS

FIG. 1A is a magnified side view of an integrated optically pumped vertical cavity surface emitting laser.

FIG. 1B is a magnified cross-sectional front view of the integrated optically pumped vertical cavity surface emitting laser of FIG. 1A.

Like reference numbers and designations in the drawings indicate like elements providing similar functionality.

DETAILED DESCRIPTION OF THE PREFERRED EMBODIMENT

Figure 2A:
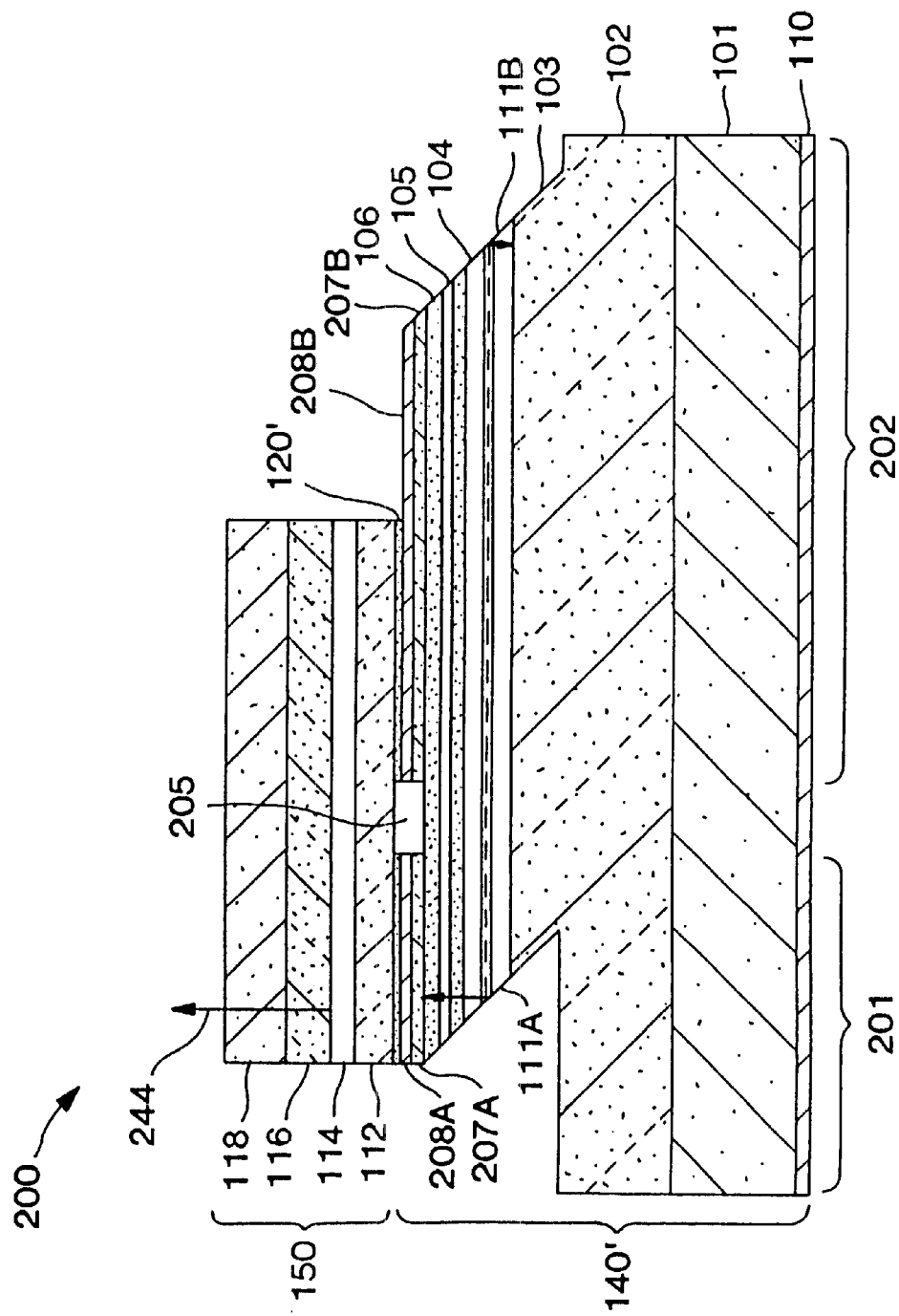
FIG. 2A is a magnified side view of a first embodiment of the modulated integrated optically pumped VCSEL of the present invention.

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

For operation at high frequencies, an optically pumped long wavelength vertical cavity surface emitting laser (VCSEL) seems to be the preferable type of semiconductor laser. A VCSEL that is optically pumped need not be doped to lase. Therefore an optically pumped VCSEL need not have its high frequency operation limited by parasitic capacitance and inductance caused by dopants and metal contact pads that would otherwise have been added. The only high frequency limits of an optically pumped VCSEL would be as a result of its intrinsic carrier transport time and thermionic emission. The high frequency limits due to intrinsic carrier transport time and thermionic emission do not usually take effect until modulation frequencies of twenty giga-Hertz (20 GHz) or more are reached. Furthermore, VCSEL emission frequency is strongly confined by its high cavity-Q and cavity resonance, and thus laser modulation chirping is not as pronounced as an electrically pumped conventional in-plane semiconductor laser. Therefore, an optically pumped VCSEL has greater commercial potential for operation at high frequencies of modulation.

In order to modulate an optically pumped VCSEL at high frequencies, the present invention directly modulates the pump laser, which in turn modulates the optically pumped VCSEL. To minimize the turn-on delay and pulse jitter, the present invention pre-biases the optically pumped VCSEL just above its threshold to ensure the maximum extinction ratio. In NRZ (non-return-to-zero) modulation, the extinction ratio (ER) is the ratio of the power output of photons in a data-on state input to the power output of photons in a data-off state input. In communications systems, a larger ER is preferred but it is usually difficult to achieve due to poor laser performance. The threshold of an optically pumped VCSEL is the input optical pump power needed for the VCSEL to reach lasing threshold. With an optically pumped VCSEL being close to its threshold level, the power output of photons from it corresponding to the data-off state is very low. Thus the ER can be very large with the optically pumped VCSEL in this condition. To accomplish this, the present invention maintains a minimum pump laser power output level just above the VCSEL threshold power level. Modulating the pump laser well beyond its own threshold current level reduces jitter and the turn-on delay becomes negligible. Additionally, any chirping of the pump laser from modulation will have a minimal impact on the optically pumped VCSEL. This is so because the optically pumped VCSEL is insensitive to wavelength variations of photons generated by the pump laser.

A limiting factor of the pump laser that effects the optically pumped VCSEL is the parasitics of the pump laser. Parasitics, such as resistance, capacitance and inductance, tend to limit the achievable direct modulation frequency of the electrically pumped laser, which in turn can impact the direct modulation frequency of the long wavelength VCSEL. The present invention substantially reduces the problem posed by parasitics. In a number of embodiments the pump laser has two sectional areas. One of the two sectional areas is always biased with a current so as to keep the pump laser turned on. This one sectional area is always sufficiently biased by a current to keep the optically pumped VCSEL just at its lasing threshold. The second of the two sectional areas is used to modulate the pump laser, which in turn modulates the optically pumped VCSEL. Splitting the pump laser into two sectional areas partitions the parasitics so that a lower level of parasitics in the pump laser need only be modulated. In another embodiment, an electric-absorption (EA) modulator is used to modulate the light or photons generated by the pump laser before being coupled into the optically pumped VCSEL. The parasitics associated with modulating the electric-absorption (EA) modulator are minimal such that modulation of the optically pumped VCSEL can occur at high frequencies.

The present invention provides a modulated integrated optically pumped VCSEL, which is optically pumped by an electrically pumped folded cavity surface emitting laser (FCSEL). The modulated integrated optically pumped VCSEL can be modulated at high frequencies and is preferably formed to generated photons of relatively long wavelengths. The FCSEL is electrically pumped and its photon output modulated in order to modulate the optically pumped VCSEL at high speeds. The integrated optically pumped vertical cavity surface emitting laser (VCSEL) is formed by integrating the electrically pumped FCSEL with an optically pumped VCSEL. Preferably, the FCSEL is designed to emit photons of relatively short wavelengths while the optically pumped VCSEL is designed to emit photons of relatively long wavelengths. The electrically pumped FCSEL and optically pumped VCSEL can be integrated together in a number of ways including atomic bonding, wafer bonding, metal bonding, epoxy glue or other well known semiconductor bonding techniques. A number of embodiments of the modulated integrated optically pumped VCSEL are disclosed.

The electrically pumped FCSEL is preferably designed to operate at relatively short wavelengths (from 770 nanometers (nm) to 1100 nanometers (nm)) with an optically pumped VCSEL designed to operate preferably at relatively long wavelengths (from 1250 nm to 1700 nm). The optically pumped VCSEL operates without the use of electric power by being optically pumped by the electrically pumped FCSEL. Integration of the lasers depends upon the type of semiconductor materials utilized in forming the two lasers. The two lasers are integrated into one unit through semiconductor processing methods such as monolithic epitaxial growth or by joining outer layers of the two lasers together through atomic bonding, wafer bonding, metal bonding, epoxy glue or other well known semiconductor bonding techniques. Additionally, the optically pumped VCSEL can be bonded to the FCSEL at an angle in order to avoid reflected light from the long wavelength VCSEL being directly returned to the in-plane laser to thereby avoiding optical noise being fed back into the FCSEL. A third laser can also be used to generate a small spot pump beam to couple to the optically pumped VCSEL in order to gain guide photons to emit at a single mode transversely. Although the electrically pumped FCSEL, also referred to as the pump laser, can be multimode either longitudinally or transversely, the output from the optically pumped VCSEL is single mode longitudinally. The output from the optically pumped VCSEL can be single mode transversely depending upon the geometric integration scheme and patterning. It is preferred that the optically pumped VCSEL operate in a single transverse mode to optimally couple with a single mode fiber. Modulation of the optically pumped VCSEL can be achieved through direct electrical modulation of the pump laser or an electric-absorption modulator.

Referring now to FIG. 1A, an integrated optically pumped VCSEL 100 is illustrated. The integrated optically pumped VCSEL 100 includes a folded cavity surface emitting laser (FCSEL) 140 integrated with an optically pumped VCSEL 150. The folded cavity surface emitting laser 140 includes a substrate 101, a distributed Bragg reflector (DBR) 102, an active area 104, a confinement layer 105, a cladding layer 106, a semiconductor contact layer 107, a first metal layer as a top contact terminal 108, a second metal layer as a base terminal 110, and the facets or beam steering elements 111A and 111B.

Substrate 101 of the FCSEL 104 is preferably an n-type doped Gallium-Arsenide (GaAs) layer. Alternatively, the substrate 101 can be a layer of an n-type doped Indium-Phosphide (InP) or other semiconductor materials.

The DBR 102 is preferably doped to match the substrate 101. For example, in the case that the substrate 101 is an n-type doped Indium-Phosphide (InP) or Gallium-Arsenide (GaAs) substrate, the DBR 102 is n-type doped as well. The layers of the DBR 102 are preferably formed from n-type $Al_xGa_{1-x}As/Al_yGa_{1-y}As$ pairs of material with x ranging from 0 and 0.5, and y ranging from 0.5 and 1 for a GaAs substrate. The number of pairs may range from as few as five to as many as forty with the typical number of pairs being about twenty pairs of layers. Alternatively, an Indium-Aluminum-Gallium-Arsenide/Indium-Phosphide (InAlGaAs/InP) distributed Bragg Reflector (DBR), an Indium-Gallium-Arsenide-Phosphide/Indium-Phosphide (InGaAsP/InP) DBR, or other monolithic grown DBR mirror can be grown onto the substrate 101 if it is an InP substrate. If wafer bonding techniques are used, a Gallium-Arsenide/Aluminum-Gallium-Arsenide (GaAs/AlGaAs) distributed Bragg reflector (DBR) or a dielectric DBR can be bonded to the substrate 101 and the active area 104. In the case of wafer bonding, the substrate 101 is preferably GaAs. Exemplary dielectric materials for a dielectric DBR include titanium di-oxide ($TiO_2$), silicon di-oxide ($SiO_2$), and silicon nitrogen di-oxide ($SiNO_2$).

The active area 104 can be a Gallium-Arsenide (GaAs), an Aluminum-Gallium-Arsenide (AlGaAs), or an Indium-Gallium-Arsenide (InGaAs) quantum well structure. The active area 104 of the FCSEL 140 in the preferred embodiment is a GaAs quantum well structure. The quantum well structure can be formed of a single quantum well or multiple quantum wells but in the preferred embodiment one to three quantum wells are utilized.

The cladding layer 106 of the FCSEL 140 is a p-type GaAs and can alternately be a p-type AlGaAs layer.

The confinement layer 105 of the FCSEL 140 is preferably an Aluminum-Gallium-Arsenide (AlGaAs) layer with aluminum content at larger than 90% and preferably larger than 95%. The Aluminum-Gallium-Arsenide (AlGaAs) layer 105 is formed within a part of the cladding 106 to allow lateral oxidation during device fabrication. Alternately, the confinement layer 105 is formed by oxidizing a portion of an Aluminum-Arsenide (AlAs) layer into an Aluminum-Oxide ($Al_2O_3$) region. The confinement layer 105 provides both current confinement and optical confinement for the FCSEL 140. Referring momentarily to FIG. 1B, the confinement layer 105 is oxidized to form a narrow conductive stripe above the active region 104 as illustrated.

The semiconductor contact layer 107 is provided so as to make an ohmic contact to the metal layer of the top contact terminal 108 deposited on its top surface. The semiconductor contact layer 107 is preferably a Gallium-Arsenide (GaAs) layer highly doped to be p-type semiconductor so as to provide an ohmic contact.

The first metal layer of the top contact terminal 108 forms a first terminal of the integrated optically pumped VCSEL 100. Referring momentarily to FIG. 1B, the metal layer for the top contact terminal 108 is only left deposited in certain areas of the semiconductor contact layer 107 so as not to block areas where photons are emitted or interfere with the coupling to the optically pumped VCSEL 150.

The second metal layer for the base terminal 110 is deposited on the bottom surface of the substrate 101 in order to form the second terminal of the integrated optically pumped VCSEL 100.

The FCSEL 100 is an electrically pumped semiconductor laser which has a folded laser cavity provided by a pair facets (also referred to as reflectors or beam steering elements) 111A and 111B at opposite ends. Preferably the external-angled beam steering element 111B and the internal-angled beam steering element 111A are approximately forty five degree angles with the incident light to form the folded cavity of the folded cavity surface emitting laser 140. The beam steering elements 111A and 111B are preferably parallel to each other and formed by cleaving, etching, ion milling or other well known semiconductor process. The active area 104 of the FCSEL has the external-angled beam steering element 111B and the internal-angled beam steering element 111A formed from processing its material layers. The external-angled beam steering element 111B and the internal-angled beam steering element 111A may continue and be formed into the cladding 106, the contact layer 107, and a portion 103 of the DBR 102 as illustrated in the Figures. A dielectric coating (not shown) may be added to the facets 111A and 111B to act as a mirror coating to increase the reflectivity efficiency or as a surface passivation.

To manufacture the FCSEL 140, the layers of materials are first deposited or grown from the beginning layer of the substrate 101. After forming a monolithic structure consisting of the substrate 101, the DBR 102, the active region 104, the cladding layer 106 with the confinement layer 105, and the contact layer 107, the facets 101A and 101B can be formed. The facets 101A and 101B are formed by cleaving, etching, ion milling or other semiconductor process to remove material.

The optically pumped VCSEL 150 includes a first distributed Bragg reflector (DBR) 112, a quantum well active area 114, a second distributed Bragg reflector (DBR) 116, and a substrate 118. The first DBR 112 can be an $Al_xGa_{1-x}As/Al_yGa_{1-y}As$ DBR, an InP/InGaAsP DBR, or a dielectric DBR, and is preferably a dielectric DBR. The active area 114 can be InGaAsP, InAlGaAs, InGaAs, InGaAsN, or GaAsSb quantum well structure having multiple quantum wells. The second DBR 116 can be an $Al_xGa_{1-x}As/Al_yGa_{1-y}As$ DBR, an InGaAsP/InP DBR or a dielectric DBR, and is preferably made of pairs of InGaAsP/InP. The substrate 118 of the optically pumped VCSEL 150 can be a layer of GaAs or of Indium-Phosphide (InP), and is preferably an InP substrate. DBRs 112 and 116 are preferably made of thicknesses to provide substantial (preferably 99% or more) reflection of long wavelengths at 1.3 um or 1.55 um to amplify and stimulate emission. In FIGS. 1A and 1B, the folded cavity surface emitting laser 140 and the optically pumped VCSEL 150 are integrated together at the interface 120 by either fusing, gluing, metal bonding, epoxy bonding or other well-known semiconductor bonding methods. In this case, interface 120 represents the joining of the surfaces and a layer of material, if any, to join the surfaces. The interface 120 can alternately be an air gap in the case where the FCSEL 140 and the optically pumped VCSEL 150 are held mechanically aligned together.

In operation, the folded cavity surface emitting laser 140 generates a short wavelength laser beam 109 which is reflected between the beam steering element 111A, beam steering element 111B, DBR 102, and the contact layer 107 as the laser beam elements 109A, 109B and 109C. The in-plane laser beam 109A is reflected by beam steering element 111A into the substantially perpendicular beam 109B for coupling into the VCSEL 150 to optically pump it. After becoming sufficiently pumped to reach lasing threshold, the optically pumped VCSEL 150 emits photons 144 preferably of a relatively long wavelength as a laser beam.

Referring now to FIG. 2A, a magnified side view of a modulated integrated optically pumped VCSEL 200 is illustrated. The modulated integrated optically pumped VCSEL 200 includes the VCSEL 150 and a two-section FCSEL 140'. But for those described below, the elements of optically pumped VCSEL 150 are the same as those described with reference to FIGS. 1A–1B and are not repeated here. The two-section FCSEL 140' is similar to FCSEL 140 except that the two-section FCSEL 140' is separated into two sections, a first section 201 and a second section 202 by a gap 205. The gap 205 may be an airgap or a gap filed with an insulative or dielectric material. The gap 205 separates the semiconductor contact layer 107 of FCSEL 140 into two sections, semiconductor contact layer 207A and semiconductor contact layer 207B of FCSEL 140' in FIG. 2A. Each of the sections 201 and 202 also has its own separate contact terminal, first contact terminal 208A and second contact terminal 208B respectively, which are formed out of a deposited metal layer in the desired contact area. The separate contact terminals 208A and 208B provide for separate control of the FCSEL 140'. The gap 205 essentially forms two separate sections, first section 201 and second section 202, of the FCSEL 140'. The first section 201 of the FCSEL 140' is separately controlled by the first contact terminal 208A. The second section 202 of the FCSEL 140' is separately controlled by the second contact terminal 208B. Interface 120' couples FCSEL 140' to the VCSEL 150 and is formed similarly to interface 120 of FIGS. 1A–1B but for the gap 205.

The second section 202 of the FCSEL 140' is DC biased, while the first section 201 of the FCSEL 140' is modulated by data at a data rate, or alternatively the first section 201 can be DC biased while the second section 202 is modulated by data at a data rate. The two sections, the first section 201 and the second section 202, are controlled in such a way that the FCSEL 140' is always "on" and generating photons at one power level. When the first section 201 is "off", the second section 202 is controlled so that the pump power of the FCSEL 140' generates photons having a power level at or slightly above the lasing threshold of the optically pumped VCSEL 150. The second section 202 in this case is said to be at a threshold biased state. In this case, VCSEL 150 does not lase or minimally lases with emitted photons 244 being of a low power level and therefore can be considered turned "off". When the first section 201 is "on" in combination with the second section 202 being in a threshold biased state, the combined pump power from the first section 201 and the second section 202 of the FCSEL 140' generate photons of a second power level exceeding the threshold pump power of the VCSEL 150 so that it lases and emits photons 244. In this case, VCSEL 150 can be considered turned "on" when it lases and emits photons 244. Optically pumped VCSEL 150 is preferably a long wavelength optically pumped VCSEL to generate photons 244 at a relatively long wavelength such as 1300 nm. The elements of the optically pumped VCSEL 150 are the same as those described with respect to FIGS. 1A–1B and are not repeated here.

Figure 2B:
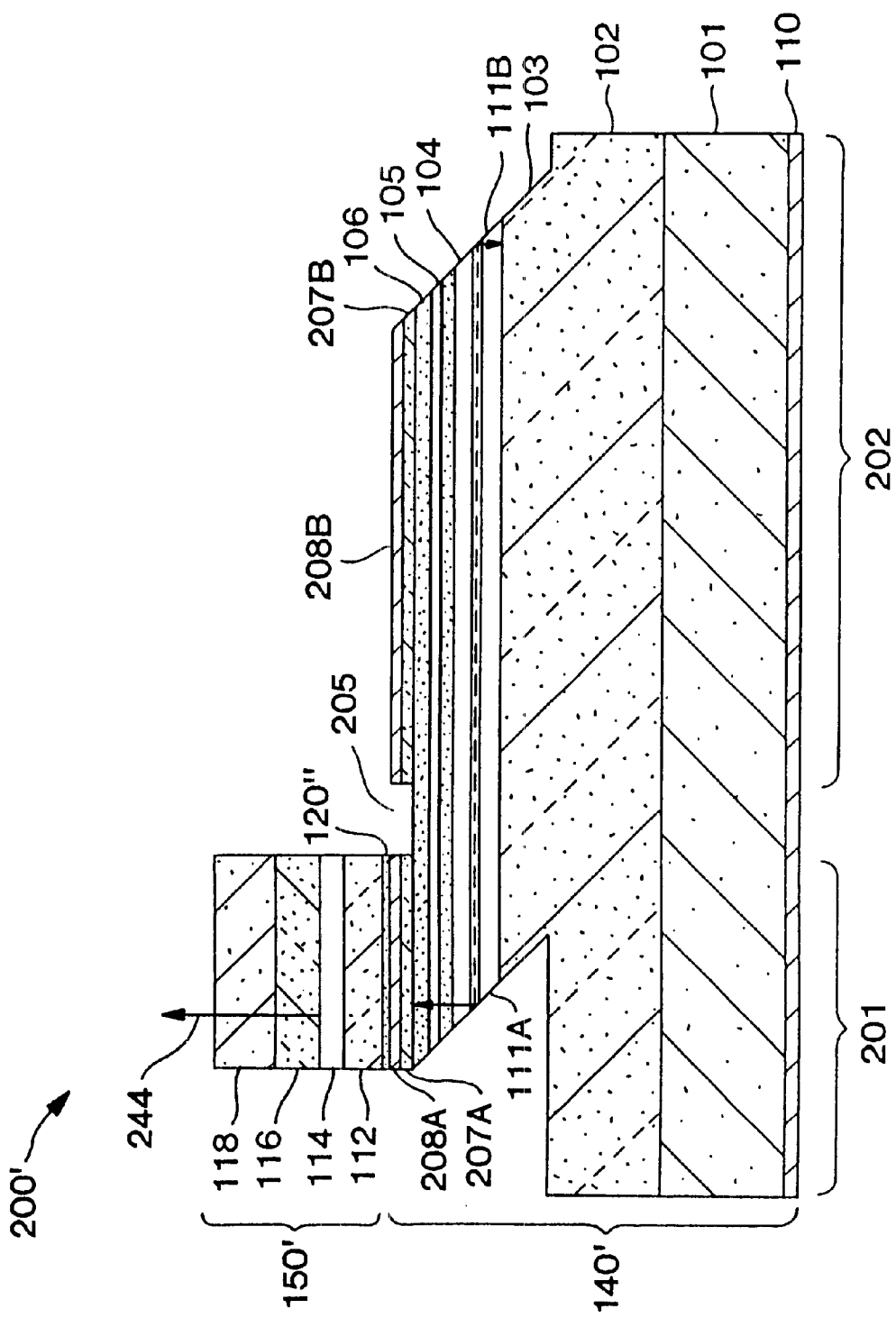
FIG. 2B is a magnified side view of a second embodiment of the modulated integrated optically pumped VCSEL of the present invention.

Referring now to FIG. 2B, a magnified side view of a modulated integrated optically pumped VCSEL 200' is illustrated. The modulated integrated optically pumped VCSEL 200' of FIG. 2B is similar to the modulated integrated optically pumped VCSEL 200 of FIG. 2A except that an unnecessary portion of the optically pumped VCSEL 150 is removed. Optically pumped VCSEL 150' is smaller that the optically pumped VCSEL 150 and utilizes semiconductor materials more efficiently. Additionally, the modulated integrated optically pumped VCSEL 200' can have a larger surface contact for the metal contact terminal 208B. VCSEL 200' retains the gap 205 to split the FCSEL 140' into two sections, the first section 201 and the second section 202. Alternatively, gap 205 may be larger or formed differently due to the fact the portion of the optically pumped VCSEL 150' is not covering the gap as in FIG. 2A.

In operation of the modulated integrated optically pumped VCSEL 200 or 200', a data modulated waveform is coupled into the first contact terminal 208A to modulate the FCSEL 140' and thereby modulate the optically pumped VCSEL 150 to emit photons 244 or not emit photons 244. A threshold bias signal is coupled into the second contact terminal 208B while a reference level is coupled into the base terminal 110. While a voltage waveform is supplied between the first contact terminal 208A and the base terminal 110 and between the second contact terminal 208B and the base terminal 110, currents generated thereby in the FCSEL 140' actually form the threshold bias and modulate the FCSEL 140' into the emission of high or low energy photons into the optically pumped VCSEL 150.

Figure 3A:
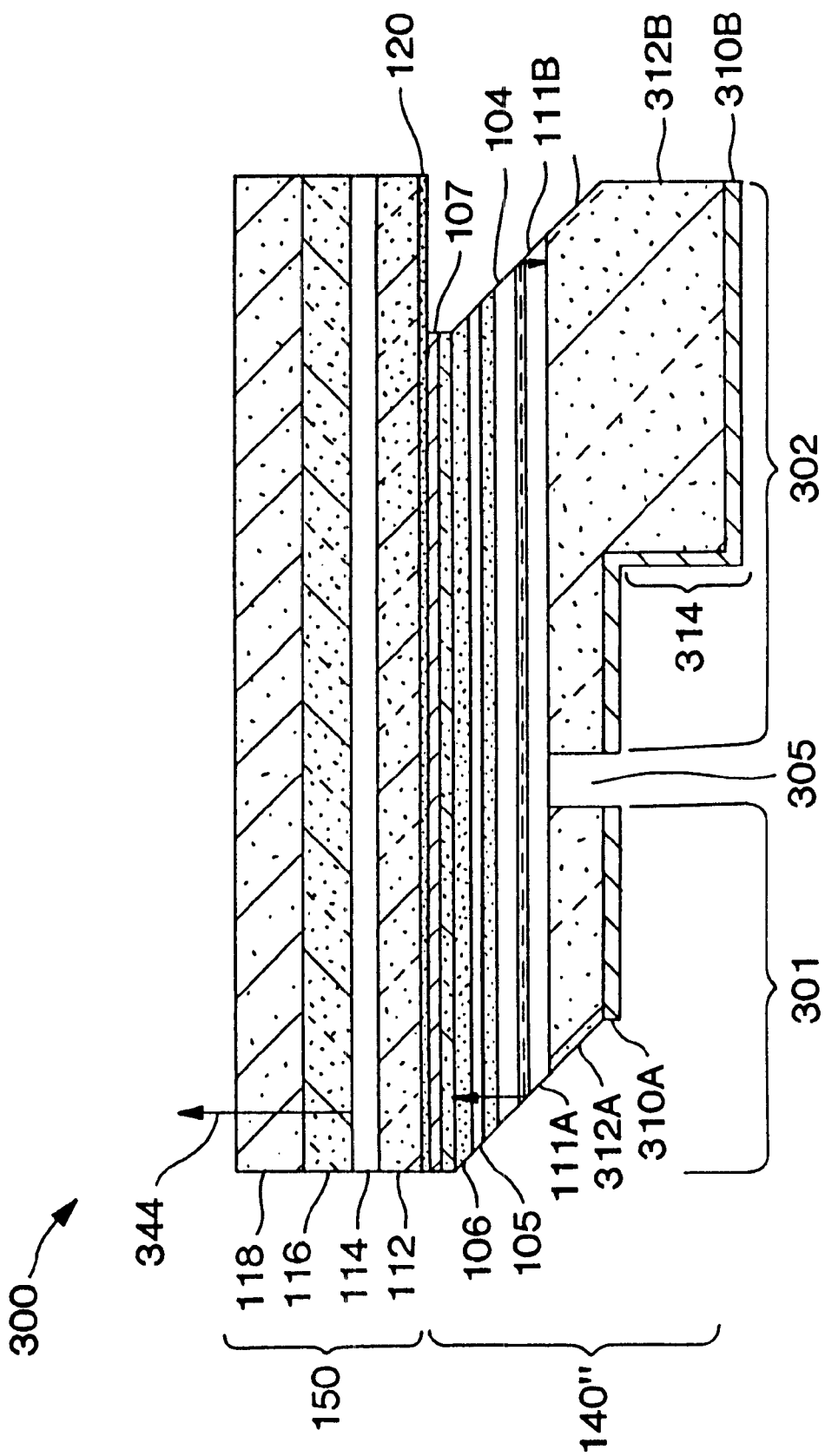
FIG. 3A is a magnified cross-sectional view of a third embodiment of the modulated integrated optically pumped VCSEL of the present invention.
Figure 3B:
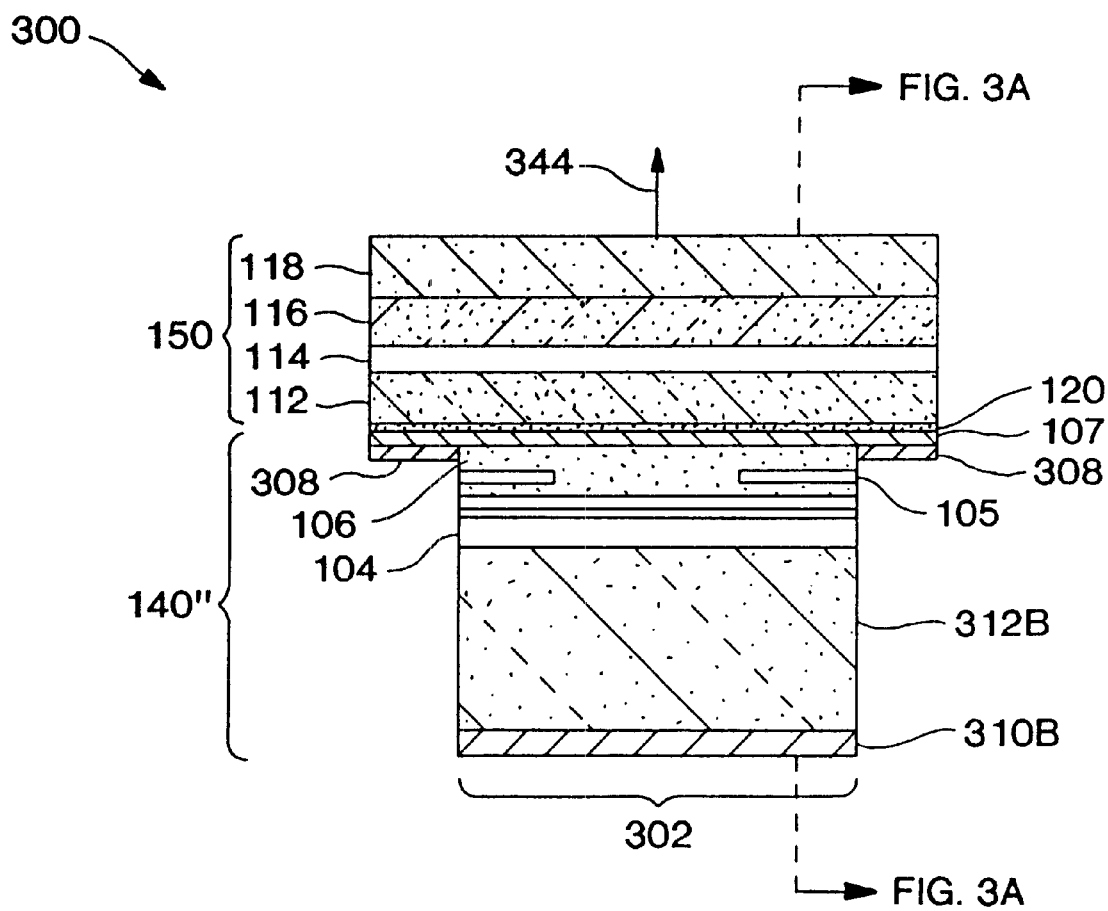
FIG. 3B is a magnified back side view of the integrated optically pumped vertical cavity surface emitting laser of FIG. 3A.

Referring now to FIG. 3A, a magnified cross-sectional side view of a modulated integrated optically pumped VCSEL 300 is illustrated. The modulated integrated optically pumped VCSEL 300 includes a FCSEL 140" and the optically pumped VCSEL 150 as illustrated in FIGS. 3A–3B. The material layers of the modulated integrated optically pumped VCSEL 300 of FIGS. 3A–3B are the same as those of the integrated optically pumped VCSEL 100 unless discussed below and are otherwise not repeated here for brevity. A wafer of optically pumped VCSELs 150 and a wafer of FCSELs 140 are initially formed in the manufacture of the modulated integrated optically pumped VCSEL 300 and joined together. To further manufacture the VCSEL 300, portions of material layers are removed. The substrate 101 (not shown in FIG. 3A) used to initially form the FCSEL 140" is removed from the VCSEL 300. In comparison with FIGS. 1, 2A, and 2B, a portion of the DBR 102 of the FCSEL is removed, including a gap 305, to form a first DBR section 312A and a second DBR section 312B.

Initially before the removal of materials, wafer boding is used to join together in alignment, the optically pumped VCSELs 150 in a wafer format with the FCSELs 140 in a wafer format. The device fabrication process of the modulated integrated optically pumped VCSELs 300 starts from the exposed substrate 101 of the FCSELs 140 in the joined wafers. First the substrate 101 is removed and a portion of the DBR 102 of the FCSELs is removed, including a gap 305, to form a first DBR section 312A and a second DBR section 312B of the FCSELs 140". A metal layer is then deposited in two desired contact terminal areas onto the first DBR section 312A and the second DBR section 312B to form a first contact terminal 310A and a second contact terminal 310B. On the FCSEL side of the joined wafers, sufficient portions of FCSEL material layers are etched away to expose an area of the semiconductor contact layer 107 for making p-type electrical contact from the same side as the n-type metal contacts. A metal layer is then deposited onto desired areas of the semiconductor contact layer 107 to form the p-contact terminal 308 and the DBR sections 312A and 312B to form the n-contact terminals 310A and 310B respectively. Referring now to FIG. 3B, the p-contact terminal 308 couples to the semiconductor contact layer 107 and the n-contact terminal 310B couples to the DBR section 312B as illustrated. The p-contact terminal 308 extends across the first section 301 and the second section 302 of the FCSEL 140".

FCSEL 140" is a sectional FCSEL having the first section 301 and the second section 302 formed by the gap 305. The gap 305 may be an airgap or a gap filed with an insulative or dielectric material. The gap 305 separates the DBR 102 of FCSEL 140 into two sections, a first DBR section 312A and a second DBR section 312B of the FCSEL 140". Each of the DBR sections 312A and 312B also has its own separate metal contact terminal, first contact terminal 310A and second contact terminal 310B respectively, which are formed out of a deposited metal layer in the desired contact area. The separate contact terminals 310A and 310B provide for separate control of the FCSEL 140". The first section 301 of the FCSEL 140" is separately controlled by the first contact terminal 310A. The second section 302 of the FCSEL 140" is separately controlled by the second contact terminal 310B.

The second section 302 of the FCSEL 140" is DC biased, while the first section 301 of the FCSEL 140" is modulated by data at a data rate, or alternatively the first section 301 can be DC biased while the second section 302 is modulated by data at a data rate. The first section 301 and the second section 302 are controlled in such a way that the FCSEL 140" is always "on" and generating photons but not necessarily at the same power level. When the first section 301 is "off", the second section 302 is controlled so that the pump power of the FCSEL 140" generates photons having a power level at the lasing threshold of the optically pumped VCSEL 150. The second section 302 is said to be at a threshold biased state. In this case, VCSEL 150 does not lase or minimally lases with emitted photons 344 being of a low power level and therefore can be considered turned "off". When the first section 301 is "on" in combination with the second section 302 being in a threshold biased state, the combined pump power from the first section 301 and the second section 302 of the FCSEL 140" is at a level exceeding the threshold pump power of the VCSEL 150 so that it lase and emits photons 344. In this case, VCSEL 150 can be considered turned "on" when it lases and emits photons 344.

In operation, a data modulated waveform is coupled into the first contact terminal 310A to modulate the FCSEL 140" and thereby modulate the optically pumped VCSEL 150 to emit photons 344 or not emit photons 344. A threshold bias signal is coupled into the second contact terminal 310B while a reference level is coupled into the contact terminal 308. While a voltage or current waveform is supplied between the first contact terminal 310A and the contact terminal 308 and between the second contact terminal 310B and the contact terminal 308, currents generated thereby in the FCSEL 140" actually form the threshold bias and modulate the FCSEL 140" into the emission of high or low energy photons into the optically pumped VCSEL 150.

In the embodiments illustrated in FIGS. 2A, 2B, and 3A–3B of the present invention, the pump laser is split into two sections. In FIGS. 2A and 2B, FCSEL 140' is split into the first section 201 and the second section 202 by a gap 205. In FIGS. 3A–3B, FCSEL 140" is split into the first section 301 and the second section 302. The parasitics as seen from the point of view of the electrical connections to the pump laser are also split in two. As a result, the dynamic parasitics associated with data modulation of the first section 201 through the first contact terminal 208A and of the first section 301 through the first contact terminal 310A are reduced from that of modulating the top contact terminal 108 of FIGS. 1A–1B. The dynamic parasitic reduction at the first contact terminal 208A is because only a small section of the pump FCSEL 140', the first section 201, needs to be modulated. The dynamic parasitic reduction at the first contact terminal 310A is because only a small section of the pump FCSEL 140", the first section 301, needs to be modulated. With a low level of dynamic parasitics at the pump laser, higher pump modulation frequencies can be obtained. The higher pump modulation frequencies enable a higher modulation frequency in the optically pumped VCSEL 150 and 150' as well.

Figure 4:
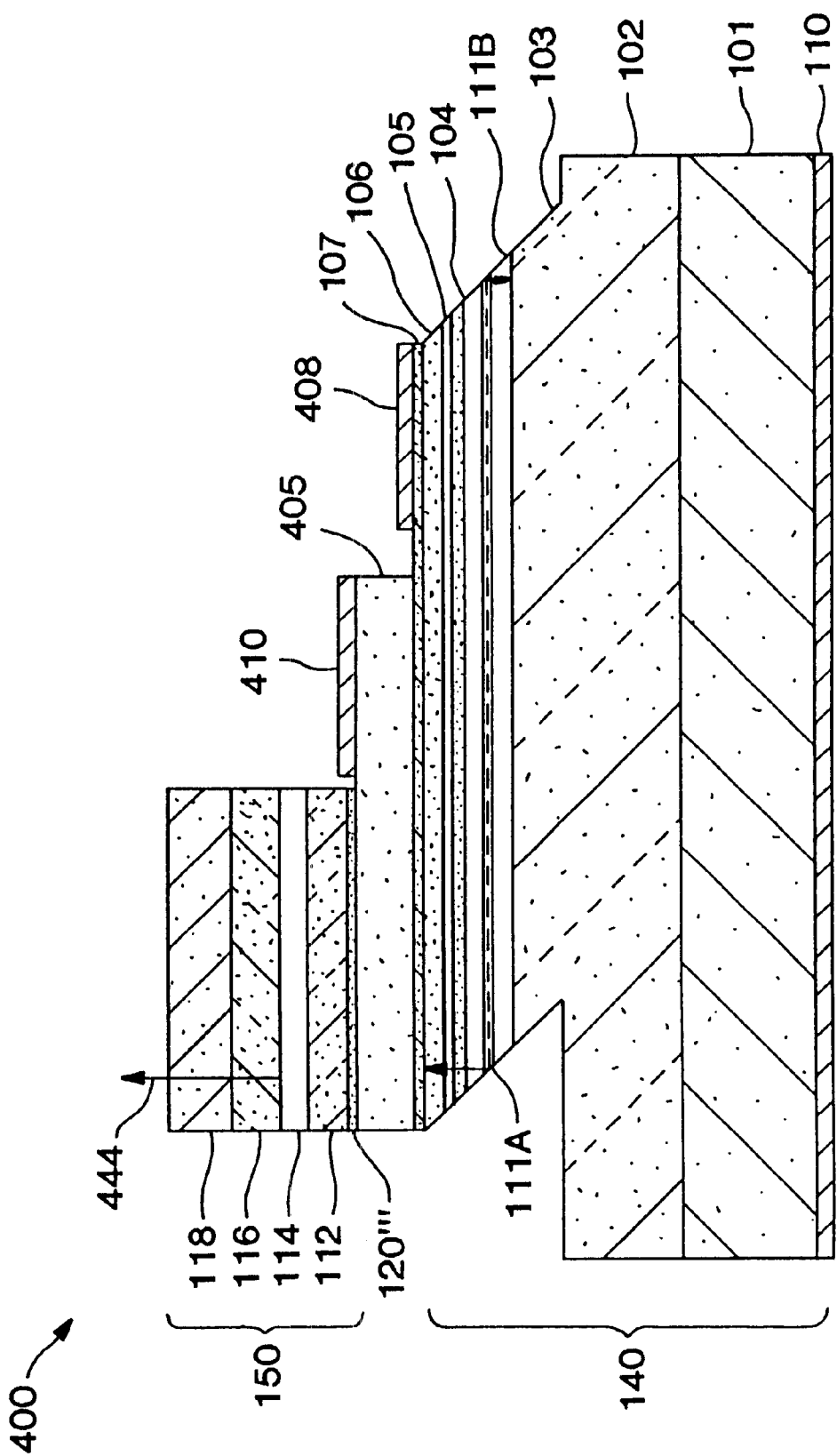
FIG. 4 is a magnified side view of a fourth embodiment of the modulated integrated optically pumped VCSEL of the present invention.

Referring now to FIG. 4, a magnified side view of a modulated integrated optically pumped VCSEL 400 is illustrated. The modulated integrated optically pumped VCSEL 400 which is the preferred embodiment includes an electrically pumped surface emitting laser, the optically pumped VCSEL 150 and a surface integrated electric-absorption (EA) modulator 405 sandwiched there-between along with the interface 120'". The electrically pumped surface emitting laser can be an electrically pumped inplane surface emitting laser, an electrically pumped grating surface emitting laser, an electrically pumped VCSEL, or an electrically pumped FCSEL 140 as shown in FIG. 4. The elements of the material layers of the FCSEL 140 and the VCSEL 150 of the modulated integrated optically pumped VCSEL 400 are the same as those described with reference to FIGS. 1A–1B and are not repeated herein for brevity.

The electric-absorption (EA) modulator 405 is formed of multiple quantum wells sandwiched between cladding layers and contact layers. The optically pumped VCSEL 150 is coupled to the EA modulator 405 through the interface 120'". Interface 120'" is formed similarly to interface 120 of FIGS. 1A–1B. The EA modulator 405 couples to the semiconductor contact layer 107 of the electrically pumped FCSEL 140. The EA modulator 405 is used to modulate the light or photons generated by the electrically pumped FCSEL 140 before they are coupled into the optically pumped VCSEL 150. The EA modulator 405 acts similar to a shutter of a still camera. In the "on" state, the photons generated by the electrically pumped FCSEL 140 is transmitted through the EA modulator 405 into the optically pumped VCSEL 150 without being absorbed. In the "off" state, the EA modulator 405 is highly absorptive and attenuates the photons emitted by the electrically pumped FCSEL 140 before they reach the optically pumped VCSEL 150. The EA modulator 405 includes contact terminals 410 and 408 for modulation control. A modulated voltage is provided between the contact terminals 410 and 408 to modulate the modulated integrated optically pumped VCSEL 400. The modulated voltage is generated in response to a desired data modulation signal and causes the EA modulator 405 to attenuate photons at one voltage level and allow them to pass at another voltage level.

The parasitics associated with modulating the EA modulator 405 are minimal such that modulation of the optically pumped VCSEL can occur at high frequencies. The EA modulator 405 inherently has chirping but does not effect the optically pumped VCSEL 150. The optically pumped VCSEL 150 is relatively insensitive to variations of the input pump wavelength. The EA modulator 405 may have a poor extinction ratio of photons but this does not pose a problem for the modulated integrated optically pumped VCSEL 400.

This is because it is not necessary to completely turn off the electrically pumped FCSEL 140 during an "off" state in order that photons 444 are not emitted. The pump power need only be maintained at or near the threshold pump level of the optically pumped VCSEL 150 so that photons 444 are not emitted. Essentially the modulation frequency of the modulated integrated optically pumped VCSEL 400 is limited only by the carrier transport and the thermionic emission effect of the optically pumped VCSEL 150.

Figure 5A:
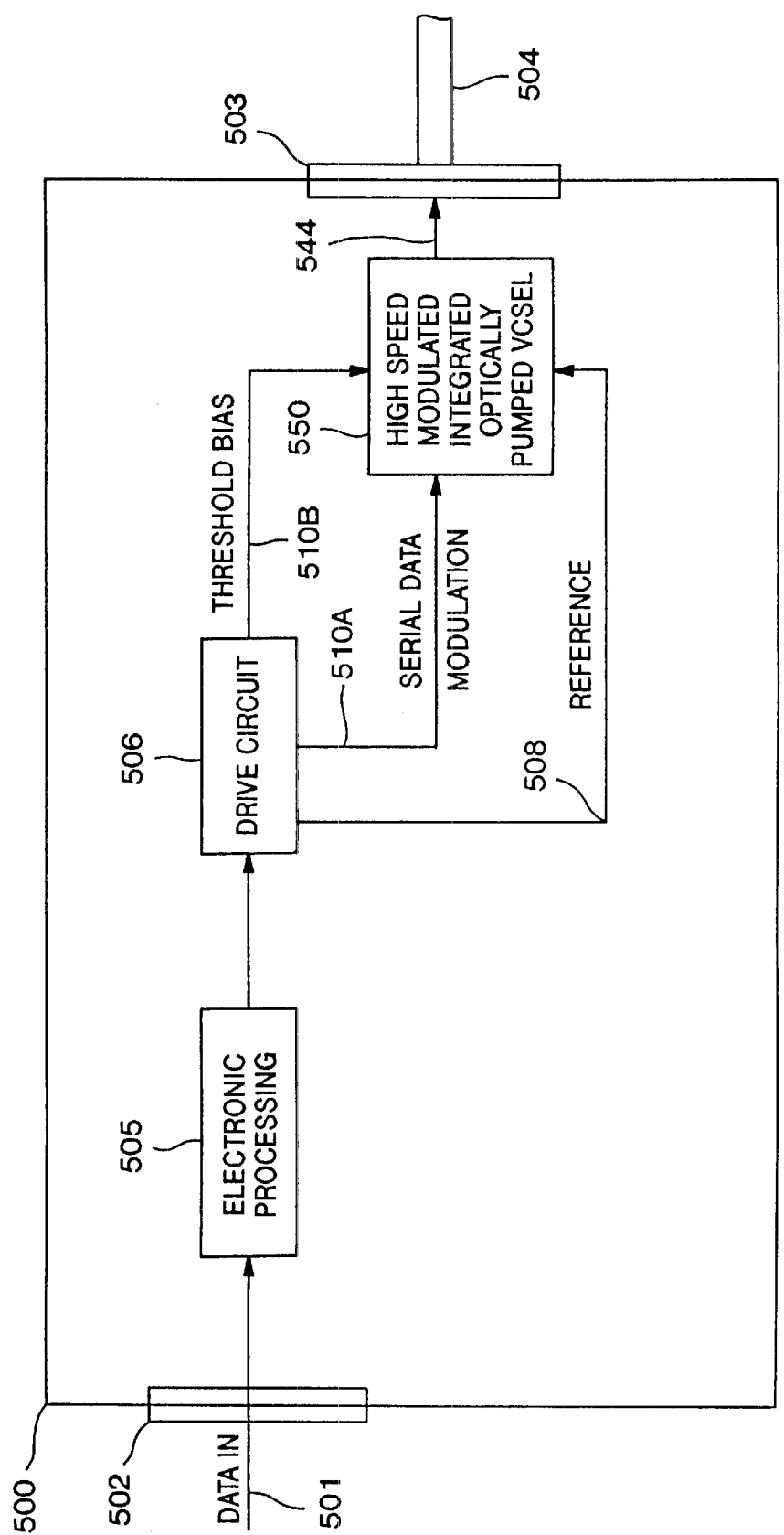
FIG. 5A is a block diagram of a system for modulating the modulated integrated optically pumped VCSELs of FIG. 2A, FIG. 2B, and FIGS. 3A–3B.

Referring now to FIG. 5A, a block diagram of a system 500 for modulation of the embodiments of the modulated integrated optically pumped VCSELs 200, 200', and 300 is illustrated. The system 500 receives a data input 501 through an electronic interface 502 such as a wire, cable, or pins. By means of an optical interface 503, such as a collimating lens or fiber pigtail, the system 500 couples to an optical fiber 504. Drive circuitry 506 generates the proper drive currents for a serial data modulation signal 510A and a threshold bias signal 510B with respect to the reference 508. The serial data modulation signal 510A and the threshold bias signal 510B are respectively coupled to terminals 208A and 208B of VCSEL 200, terminals 208A and 208B of VCSEL 200', or terminals 310A and 310B of VCSEL 300. The reference signal 508 of the drive circuitry 506 is coupled to the base terminal 110 of VCSEL 200 and VCSEL 200', and top contact terminal 308 of VCSEL 300.

Figure 5B:
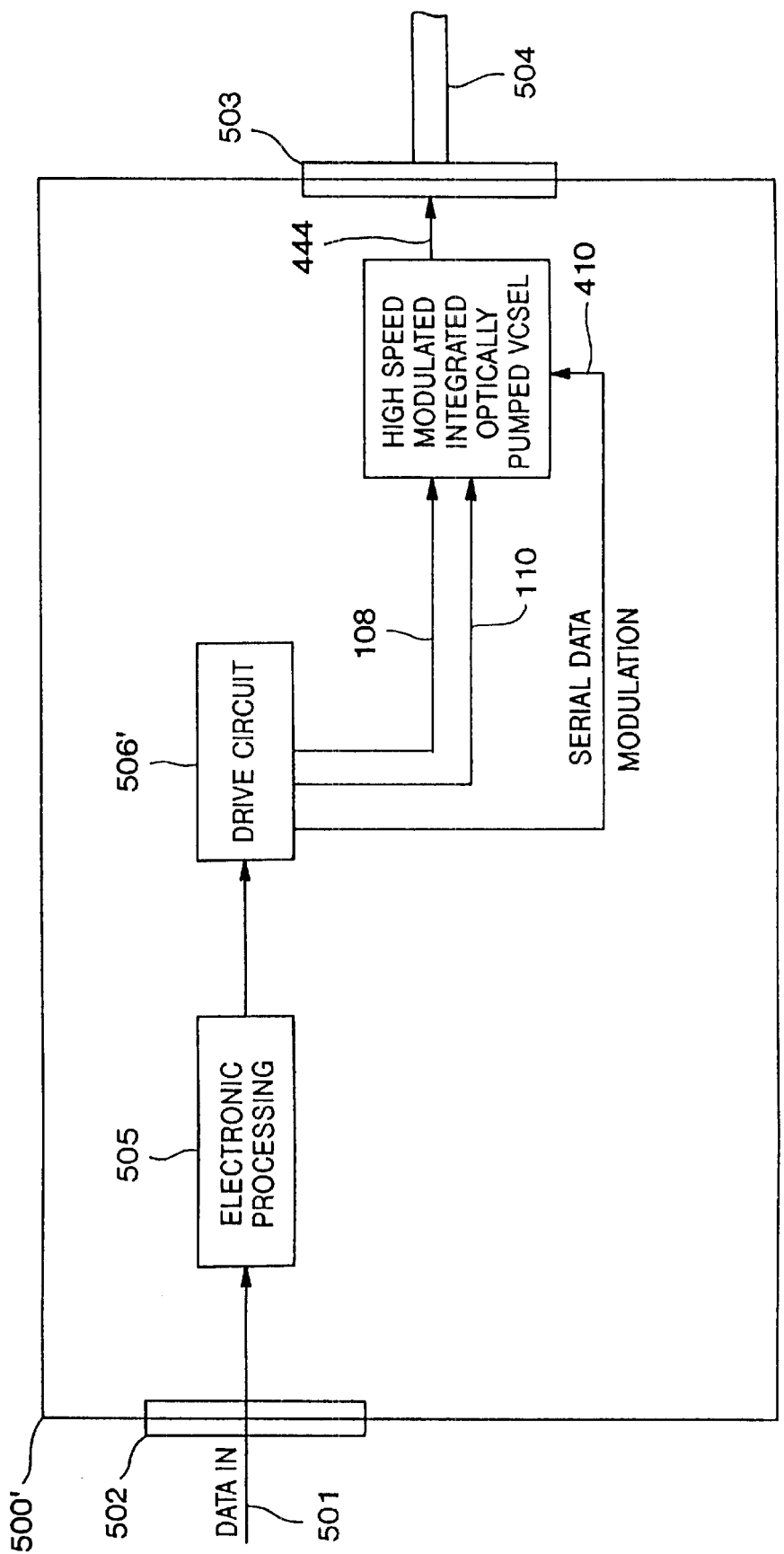
FIG. 5B is a block diagram of a system for modulating the modulated integrated optically pumped VCSEL of FIG. 4.

Referring now to FIG. 5B, a block diagram of a system 500' for modulation of the preferred embodiment of the modulated integrated optically pumped VCSEL 400 is illustrated. System 500' is similar to system 500 but for drive circuitry 506' which generates a varying voltage between the serial data modulation terminals 410 and 408 of the EA modulator 405. The drive circuitry 506' also provides a voltage or current across terminals 408 and 110 for the FCSEL 140 of the modulated integrated optically pumped VCSEL 400.

In each of the embodiments disclosed herein, the turn-on delay was minimized by maintaining the pump laser, the electrically pumped FCSEL, in a biased state generating photons with its power at or slightly above the optically pumped VCSEL threshold. Jitter is minimized in the embodiments as well for this same reason because the pump laser, the electrically pumped FCSEL, is maintained in a biased state constantly generating photons. Chirping was minimized in the embodiments of modulated integrated optically pumped VCSELs 200, 200', 300 and 400 because the VCSEL is relatively insensitive to the pump wavelength variation.

The present invention has many advantages over the prior art. One advantage of the present invention is that dynamic modulation parasitics are reduced so that modulation frequencies can be greater. Another advantage is that modulated integrated optically pumped VCSEL can be commercially manufactured. Other advantages of the present invention will become obvious to those of ordinary skill in the art after thoroughly reading this disclosure.

The preferred embodiments of the present invention are thus described. While the present invention has been described in particular embodiments, the present invention should not be construed as limited by such embodiments, but rather construed according to the claims that follow below.

What is claimed is:

1. A modulated integrated optically pumped vertical cavity surface emitting laser comprising:
    an electrically pumped surface emitting laser to generate photons;
    an electric-absorption modulator joined to the electrically pumped surface emitting laser to receive the generated photons, the electric-absorption modulator to periodically absorb the generated photons from the electrically pumped surface emitting laser in response to a modulation signal, the electric-absorption modulator to periodically pass through the generated photons from the electrically pumped surface emitting laser in response to a modulation signal; and
    an optically pumped vertical cavity surface emitting laser joined to the electric-absorption modulator, the optically pumped vertical cavity surface emitting laser to receive the pass through photons from the electric-absorption modulator generated by the electrically pumped surface emitting laser, the optically pumped vertical cavity surface emitting laser further to lase in response to the pass through photons and emit photons from the modulated integrated optically pumped vertical cavity surface emitting laser.

2. The modulated integrated optically pumped vertical cavity surface emitting laser of claim 1 wherein,
    the electric-absorption modulator includes,
        an active region having one or more quantum well structures, and
        a pair of contact terminals coupled across the active region of the electric-absorption modulator to modulate the electric-absorption modulator.

3. The modulated integrated optically pumped vertical cavity surface emitting laser of claim 2 wherein,
    the one or more quantum well structures of the electric-absorption modulator are formed to absorb photons at a wavelength over a wavelength range of 600 nanometers to 1150 nanometers when in an absorption state.

4. The modulated integrated optically pumped vertical cavity surface emitting laser of claim 1 wherein,
    the electrically pumped surface emitting laser is formed to emit photons at a wavelength over a wavelength range of 600 nanometers to 1150 nanometers when being electrically pumped.

5. The modulated integrated optically pumped vertical cavity surface emitting laser of claim 1 wherein,
    the optically pumped vertical cavity surface emitting laser is formed to operate at a wavelength over a wavelength range of 1200 nanometers to 1750 nanometers when being optically pumped.

6. The modulated integrated optically pumped vertical cavity surface emitting laser of claim 1 wherein,
    the modulation signal is responsive to a data signal.

7. The modulated integrated optically pumped vertical cavity surface emitting laser of claim 1 wherein,
    the electrically pumped surface emitting laser is an electrically pumped folded cavity surface emitting laser.

8. The modulated integrated optically pumped vertical cavity surface emitting laser of claim 7 wherein,
    the electrically pumped folded cavity surface emitting laser includes,
        an active region having one or more quantum well structures, and,
        an internal-angled beam steering element and an external-angled beam steering element formed in the active region to reflect photons.

9. The modulated integrated optically pumped vertical cavity surface emitting laser of claim 8 wherein,
    the active region of the electrically pumped folded cavity surface emitting laser has one or more Indium-Gallium-Arsenide quantum well structures, and the electrically pumped folded cavity surface emitting laser further includes,
a p-type Gallium-Arsenide cladding layer coupled to the active region, and
an oxide confinement region formed within the cladding layer.

10. The modulated integrated optically pumped vertical cavity surface emitting laser of claim 8 wherein,
the active region of the electrically pumped folded cavity surface emitting laser has one or more Gallium-Arsenide quantum well structures, and
the electrically pumped folded cavity surface emitting laser further includes,
a p-type Aluminum-Gallium-Arsenide cladding layer coupled to the active region, and
an oxide confinement region formed within the cladding layer.

11. The modulated integrated optically pumped vertical cavity surface emitting laser of claim 8 wherein,
the electrically pumped folded cavity surface emitting laser further includes,
a substrate,
a distributed Bragg reflector coupled to the substrate,
a semiconductor cladding layer,
a semiconductor contact layer, and
a top contact terminal coupled to the semiconductor contact layer and a base contact terminal coupled to the substrate.

12. The modulated integrated optically pumped vertical cavity surface emitting laser of claim 11 wherein,
the substrate is an n-type Gallium-Arsenide substrate,
the distributed Bragg reflector is an n-type Aluminum-Gallium-Arsenide distributed Bragg reflector,
the semiconductor cladding layer is a p-type Aluminum-Gallium-Arsenide cladding layer,
the semiconductor contact layer is a p-type Gallium-Arsenide contact layer, and
the top contact terminal and the base terminal are formed of metal layers.

13. The modulated integrated optically pumped vertical cavity surface emitting laser of claim 8 wherein,
the internal-angled beam steering element and the external-angled beam steering element are laser cavity mirrors formed by etching a facet at an angle to amplify the energy of the photons in the laser cavity and to steer photons to the optically pumped vertical cavity surface emitting laser.

14. The modulated integrated optically pumped vertical cavity surface emitting laser of claim 8 wherein,
the internal-angled beam steering element is a laser cavity mirror formed by etching a facet at an angle to amplify the energy of the photons in the laser cavity and to steer photons to the optically pumped vertical cavity surface emitting laser, and
the external-angled beam steering element is a facet formed by cleaving or etching at a ninety degree angle to reflect the photons back into the electrically pumped laser cavity.

15. The modulated integrated optically pumped vertical cavity surface emitting laser of claim 13 wherein,
the angle that the facets are etched is in the range from thirty-five degrees to fifty-five degrees.

16. The modulated integrated optically pumped vertical cavity surface emitting laser of claim 13 wherein,
the angle that the facet are etched is in the range from forty-two degrees to forty-eight degrees.

17. The modulated integrated optically pumped vertical cavity surface emitting laser of claim 1 wherein,
the optically pumped vertical cavity surface emitting laser is a long wavelength optically pumped vertical cavity surface emitting laser having an active region formed of one or more Indium-Gallium-Arsenide-Phosphide quantum wells to be optically pumped and emit photons of a relatively long wavelength.

18. The modulated integrated optically pumped vertical cavity surface emitting laser of claim 1 wherein,
the optically pumped vertical cavity surface emitting laser is a long wavelength optically pumped vertical cavity surface emitting laser having an active region formed of one or more Indium-Aluminum-Gallium-Arsenide quantum wells to be optically pumped and emit photons of a relatively long wavelength.

19. The modulated integrated optically pumped vertical cavity surface emitting laser of claim 1 wherein,
the optically pumped vertical cavity surface emitting laser is a long wavelength optically pumped vertical cavity surface emitting laser having an active region formed of one or more Gallium-Arsenide-Antimonide quantum wells to be optically pumped and emit photons of a relatively long wavelength.

20. The modulated integrated optically pumped vertical cavity surface emitting laser of claim 1 wherein,
the optically pumped vertical cavity surface emitting laser is a long wavelength optically pumped vertical cavity surface emitting laser having an active region formed of one or more Indium-Galliurn-Arsenide-Nitride quantum wells to be optically pumped and emit photons of a relatively long wavelength.

21. The modulated integrated optically pumped vertical cavity surface emitting laser of claim 1 wherein,
the optically pumped vertical cavity surface emitting laser includes a first distributed Bragg reflector mirror formed of Aluminum-Gallium-Arsenide monolithically grown on a top layer of the in-plane surface emitting laser during its semiconductor manufacturing.

22. The modulated integrated optically pumped vertical cavity surface emitting laser of claim 1 wherein,
the optically pumped vertical cavity surface emitting laser includes an active region of one or more quantum wells, a first distributed Bragg reflector and a second distributed Bragg reflector.

23. The modulated integrated optically pumped vertical cavity surface emitting laser of claim 22 wherein,
the second distributed Bragg reflector of the optically pumped vertical cavity surface emitting laser is a dielectric mirror deposited on top of the active region.

24. The modulated integrated optically pumped vertical cavity surface emitting laser of claim 22 wherein,
the first distributed Bragg reflector of the optically pumped vertical cavity surface emitting laser is a dielectric mirror.

25. The modulated integrated optically pumped vertical cavity surface emitting laser of claim 22 wherein,
the optically pumped vertical cavity surface emitting laser includes an oxide region in the first or the second distributed Bragg reflector to guide photons to emit at a single mode transversely.

26. The modulated integrated optically pumped vertical cavity surface emitting laser of claim 22 wherein,
the optically pumped vertical cavity surface emitting laser includes one or more mesa regions patterned in the first or second distributed Bragg reflector to index guide photons to emit at a single mode transversely.

27. The modulated integrated optically pumped vertical cavity surface emitting laser of claim 1 further comprising;
   a third laser to generate a small spot pump beam to couple to the optically pumped vertical cavity surface emitting laser to gain guide photons to emit at a single mode transversely.

28. A method of modulating an optically pumped vertical cavity surface emitting laser, the method comprising:
   providing an electrically pumped surface emitting laser, a beam steering element, and the optically pumped vertical cavity surface emitting laser joined together as a unit;
   modulating the photonic emission of the electrically pumped surface emitting laser in response to a data modulation signal; and
   steering the modulated photonic emission of the electrically pumped surface emitting laser into the optically pumped vertical cavity surface emitting laser, the optically pumped vertical cavity surface emitting laser generating a modulated laser beam output in response to the modulating of the photonic emission of the electrically pumped surface emitting laser.

29. The method of claim 28 wherein,
   the electrically pumped surface emitting laser generates photons of a relatively short wavelength and the optically pumped vertical cavity surface emitting laser generates a modulated laser beam having a relatively long wavelength.

30. The method of claim 28 wherein,
   the electrically pumped surface emitting laser is an electrically pumped folded cavity surface emitting laser and the beam steering element is a facet of the electrically pumped folded cavity surface emitting laser.

31. The method of claim 30 wherein,
   the electrically pumped folded cavity surface emitting laser is a two section folded cavity surface emitting laser having a first section and a second section, the first section being biased at a threshold state, the second section being modulated by the data modulation signal to modulate the photonic emission of the electrically pumped surface emitting laser.

32. The method of claim 28 wherein,
   an electric-absorption modulator is coupled to the electrically pumped surface emitting laser and is modulated by the data modulation signal to modulate the photonic emission of the electrically pumped surface emitting laser.

33. The method of claim 28 wherein,
   the beam steering element is external to the cavity of the electrically pumped surface emitting laser and has a reflective surface.

34. The method of claim 28 wherein,
   the electrically pumped surface emitting laser has the beam steering element that is external to its laser cavity, the beam steering element having a reflective surface.

35. A modulated integrated semiconductor laser comprising:
   an electrically pumped surface emitting semiconductor laser to generate photons;
   a modulator joined to the electrically pumped surface emitting semiconductor laser to receive the generated photons, the modulator to modulate the generated photons from the electrically pumped surface emitting semiconductor laser in response to a modulation signal; and
   an optically pumped vertical cavity surface emitting semiconductor laser joined to the modulator, the optically pumped vertical cavity surface emitting semiconductor laser to receive photons from the electrically pumped surface emitting semiconductor laser modulated by the modulator, the optically pumped vertical cavity surface emitting semiconductor laser to emit photons in response to the received photons.

36. The modulated integrated semiconductor laser of claim 35 wherein,
   the electrically pumped surface emitting semiconductor laser includes,
      an active region having one or more quantum well structures, and,
      an internal-angled beam steering element and an external-angled beam steering element formed at ends of the active region to reflect photons.

37. The modulated integrated semiconductor laser of claim 35 wherein,
   the modulator is an electric-absorption modulator that is responsive to a data modulation signal.

38. The modulated integrated semiconductor laser of claim 35 wherein,
   the electrically pumped surface emitting semiconductor laser is a folded cavity surface emitting laser.

39. The modulated integrated semiconductor laser of claim 35 wherein,
   the vertical cavity surface emitting laser includes an active region of one or more quantum wells, a first distributed Bragg reflector and a second distributed Bragg reflector.

40. A modulated integrated semiconductor laser comprising:
   an electrically pumped surface emitting semiconductor laser means to generate photons;
   a modulation means joined to the electrically pumped surface emitting semiconductor laser means to modulate the generated photons in response to a modulation signal; and
   an optically pumped vertical cavity surface emitting semiconductor laser means joined to the modulation means, the optically pumped vertical cavity surface emitting semiconductor laser means to receive photons from the modulation means generated by the electrically pumped surface emitting semiconductor laser means, the optically pumped vertical cavity surface emitting semiconductor laser means to emit photons in response to the received photons.

41. The modulated integrated semiconductor laser of claim 40 wherein,
   the electrically pumped surface emitting semiconductor laser means includes,
      a beam steering means to reflect photons towards the optically pumped vertical cavity surface emitting semiconductor laser means.

42. The modulated integrated semiconductor laser of claim 40 further comprising:
   a beam steering means to reflect photons from the electrically pumped surface emitting semiconductor laser means towards the optically pumped vertical cavity surface emitting semiconductor laser means.

43. The modulated integrated semiconductor laser of claim 40 wherein,
   the modulation means is an electric-absorption modulator that is responsive to a data modulation signal.

44. The modulated integrated semiconductor laser of claim 40 wherein,
the electrically pumped surface emitting semiconductor laser means is a folded cavity surface emitting laser.

45. The modulated integrated semiconductor laser of claim 40 wherein,
the vertical cavity surface emitting laser means includes an active region of one or more quantum wells, a first distributed Bragg reflector and a second distributed Bragg reflector.

46. A modulated integrated optically pumped vertical cavity surface emitting laser comprising:
an electrically pumped surface emitting laser to generate photons;
an electric-absorption modulator joined to the electrically pumped surface emitting laser to modulate the generated photons from the electrically pumped surface emitting laser in response to a modulation signal; and
an optically pumped vertical cavity surface emitting laser joined to the electrically pumped surface emitting laser and modulated by the integrated electric-absorption modulator, the optically pumped vertical cavity surface emitting laser further to emit photons in response to receiving photons from the modulated integrated optically pumped vertical cavity surface emitting laser.

47. The modulated integrated optically pumped vertical cavity surface emitting laser of claim 46 wherein,
the electric-absorption modulator includes,
an active region having one or more quantum well structures, and
a pair of contact terminals coupled across the active region of the electric-absorption modulator to drive the electric-absorption modulator.

48. The modulated integrated optically pumped vertical cavity surface emitting laser of claim 46 wherein,
the electrically pumped surface emitting semiconductor laser is a folded cavity surface emitting laser.

49. The modulated integrated optically pumped vertical cavity surface emitting laser of claim 46 wherein,
the electrically pumped surface emitting laser is a folded cavity surface emitting laser.

50. A modulated integrated semiconductor laser comprising:
an electrically pumped surface emitting semiconductor laser to generate photons;
a modulator joined to the electrically pumped surface emitting semiconductor laser to modulate generation of photons by the electrically pumped surface emitting semiconductor laser in response to a modulation signal; and
a vertical cavity surface emitting semiconductor laser joined to the modulator, the vertical cavity surface emitting semiconductor laser to receive photons from the electrically pumped surface emitting semiconductor laser modulated by the modulator, the vertical cavity surface emitting semiconductor laser to emit photons in response to the received photons.

51. The modulated integrated semiconductor laser of claim 50 wherein,
the electrically pumped surface emitting semiconductor laser includes,
an active region having one or more quantum well structures, and,
a beam steering element to steer photons from the electrically pumped surface emitting semiconductor laser to the vertical cavity surface emitting semiconductor laser.

52. The modulated integrated semiconductor laser of claim 50 wherein,
the electrically pumped surface emitting semiconductor laser is a folded cavity surface emitting laser.

53. The modulated integrated semiconductor laser of claim 50 wherein,
the vertical cavity surface emitting laser includes an active region of one or more quantum wells, a first distributed Bragg reflector and a second distributed Bragg reflector.

54. A modulated integrated semiconductor laser comprising:
an electrically pumped surface emitting semiconductor laser to generate photons;
a modulator joined to the electrically pumped surface emitting semiconductor laser to modulate generation of photons by the electrically pumped surface emitting semiconductor laser in response to a modulation signal;
a vertical cavity surface emitting semiconductor laser joined to the modulator, the vertical cavity surface emitting semiconductor laser to receive photons from the electrically pumped surface emitting semiconductor laser modulated by the modulator, the vertical cavity surface emitting semiconductor laser to emit photons in response to the received photons; and
a beam steering element joined to the electrically pumped surface emitting semiconductor laser to steer photons from the electrically pumped surface emitting semiconductor laser to the vertical cavity surface emitting semiconductor laser.

55. The modulated integrated semiconductor laser of claim 54 wherein,
the vertical cavity surface emitting laser includes an active region of one or more quantum wells, a first distributed Bragg reflector and a second distributed Bragg reflector.

56. The modulated integrated semiconductor laser of claim 54 wherein,
the electrically pumped surface emitting semiconductor laser is a folded cavity surface emitting laser and the beam steering element is a facet of the folded cavity surface emitting laser.

57. A modulated integrated optically pumped vertical cavity surface emitting laser comprising:
an electrically pumped surface emitting laser to generate photons;
an electric-absorption modulator joined to the electrically pumped surface emitting laser to receive the generated photons, the electric-absorption modulator to modulate the generated photons from the electrically pumped surface emitting laser in response to a modulation signal;
an optically pumped vertical cavity surface emitting laser joined to the electric-absorption modulator, the optically pumped vertical cavity surface emitting laser, to receive photons passing through the electric-absorption modulator generated by the electrically pumped surface emitting laser, the optically pumped vertical cavity surface emitting laser further to emit photons in response to receiving photons from the modulated integrated optically pumped vertical cavity surface emitting laser; and
a beam steering element joined to the electrically pumped surface emitting laser to steer photons from the electrically pumped surface emitting laser to the optically pumped vertical cavity surface emitting laser.

58. The modulated integrated optically pumped vertical cavity surface emitting laser of claim 57 wherein,
the electric-absorption modulator includes,
an active region having one or more quantum well structures, and
a pair of contact terminals coupled across the active region of the electric-absorption modulator to drive the electric-absorption modulator.

59. The modulated integrated optically pumped vertical cavity surface emitting laser of claim 57 wherein,
the optically pumped vertical cavity surface emitting laser includes an active region of one or more quantum wells, a first distributed Bragg reflector and a second distributed Bragg reflector.

60. The modulated integrated optically pumped vertical cavity surface emitting laser of claim 57 wherein,
the electrically pumped surface emitting laser is a folded cavity surface emitting laser and the beam steering element is a facet of the folded cavity surface emitting laser.

61. A modulated integrated optically pumped vertical cavity surface emitting laser comprising:
a folded cavity surface emitting laser to generate photons;
a modulator joined to the folded cavity surface emitting laser to receive the generated photons, the modulator to modulate the generated photons in response to a modulation signal; and
an optically pumped vertical cavity surface emitting laser joined to the modulator to receive modulated photons, the optically pumped vertical cavity surface emitting laser further to emit photons in response to receiving the modulated photons.

62. The modulated integrated optically pumped vertical cavity surface emitting laser of claim 61 wherein,
the modulator is an electric-absorption modulator including,
an active region having one or more quantum well structures, and
a pair of contact terminals coupled across the active region of the electric-absorption modulator to drive the electric-absorption modulator.

63. The modulated integrated optically pumped vertical cavity surface emitting laser of claim 61 wherein,
the optically pumped vertical cavity surface emitting laser includes an active region of one or more quantum wells, a first distributed Bragg reflector and a second distributed Bragg reflector.

64. A modulated integrated optically pumped vertical cavity surface emitting laser comprising:
a modulated electrically pumped surface emitting laser to generate photons in response to a modulation signal;
an optically pumped vertical cavity surface emitting laser joined to the modulated electrically pumped surface emitting laser to receive photons, the optically pumped vertical cavity surface emitting laser to emit photons in response to receiving photons from the modulated electrically pumped surface emitting laser; and
a beam steering element joined to the modulated electrically pumped surface emitting laser to steer photons from the modulated electrically pumped surface emitting laser to the optically pumped vertical cavity surface emitting laser.

65. The modulated integrated optically pumped vertical cavity surface emitting laser of claim 64 wherein,
the optically pumped vertical cavity surface emitting laser includes an active region of one or more quantum wells, a first distributed Bragg reflector and a second distributed Bragg reflector.

66. The modulated integrated optically pumped vertical cavity surface emitting laser of claim 64 wherein,
the modulated electrically pumped surface emitting laser is a folded cavity surface emitting laser and the beam steering element is a facet of the folded cavity surface emitting laser.

* * * * *